United States Patent [19]

Kohno et al.

[11] Patent Number: 4,929,295
[45] Date of Patent: May 29, 1990

[54] METHOD OF MANUFACTURING CERAMIC LAMINATE

[75] Inventors: Yoshiaki Kohno; Norio Sakai, both of Kyoto, Japan

[73] Assignee: Murata Manufacturing Co., Ltd., Japan

[21] Appl. No.: 295,047

[22] Filed: Jan. 6, 1989

[30] Foreign Application Priority Data

Jan. 7, 1988 [JP] Japan .................................. 63-1702

[51] Int. Cl.⁵ ...................... B32B 18/00; B32B 31/04
[52] U.S. Cl. .................................. 156/230; 156/89; 264/58; 264/63
[58] Field of Search .................... 156/89, 230; 264/58, 264/63

[56] References Cited

U.S. PATENT DOCUMENTS

| | | | |
|---|---|---|---|
| 4,624,896 | 11/1986 | Watanabe et al. | 156/89 |
| 4,627,160 | 12/1986 | Herron et al. | 156/89 |
| 4,649,125 | 3/1987 | Takeuchi et al. | 156/89 |
| 4,766,027 | 8/1988 | Burn | 156/89 |
| 4,799,983 | 1/1989 | Desai | 156/89 |
| 4,799,984 | 1/1989 | Rellick | 156/89 |
| 4,806,188 | 2/1989 | Rellick | 156/89 |

Primary Examiner—Caleb Weston
Attorney, Agent, or Firm—Ostrolenk, Faber, Gerb & Soffen

[57] ABSTRACT

Disclosed herein is a method of manufacturing a ceramic laminate which is adapted to manufacture a laminated ceramic capacitor, for example. This method comprises the steps of preparing a plurality of ceramic green sheets containing ceramic powder and a first binder, forming metal paste films containing metal powder and a second binder for providing internal electrodes on first major surfaces of the ceramic green sheets and stacking the plurality of ceramic green sheets with each other. In such a method, a junction member containing a solvent which can commonly dissolve the first and second binders is prepared in order to join the plurality of ceramic green sheets with no application of pressure, to be applied between adjacent pairs of the plurality of ceramic green sheets, which are stacked with each other. The junction member is adapted to join the adjacent pairs of ceramic green sheets with each other through chemical function.

16 Claims, 5 Drawing Sheets

PRIOR ART

METHOD OF MANUFACTURING CERAMIC LAMINATE

BACKGROUND OF THE INVENTION

1. Field of the Invention

The present invention relates to a method of manufacturing a ceramic laminate which is adapted to provide a laminated ceramic capacitor, a laminated LC composite part, a ceramic multilayer substrate or the like, and more specifically, it relates to a method of stacking ceramic green sheets.

2. Description of the Background Art

A component such as a laminated ceramic capacitor or a ceramic multilayer substrate, for example, having laminated structure of ceramic sheets provided with an internal electrode which is interposed in at least one interface, has been generally obtained by applying a ceramic slurry on one surface of a carrier film through a doctor blade method or the like and drying the same, separating a resulting ceramic green sheet from the carrier film, printing metal paste on the ceramic green sheet by screen printing or the like and drying the same, stacking a desired number of such ceramic green sheets to obtain a laminate, and pressurizing the laminate along the direction of stacking under pressure of hundreds of kilograms to several tons per cm$^2$ and a temperature of 40° to 80° C. This laminate is cut if necessary, and thereafter fired to obtain a sintered ceramic laminate.

FIG. 11 is a sectional view showing a ceramic multilayer substrate 1 which is obtained basically through the aforementioned steps. Referring to FIG. 11, the substrate 1 comprises a plurality of ceramic layers 2 to 9 and internal electrodes 10 to 14 which are provided in interfaces between specific ones of the ceramic layers 2 to 9. A plurality of conductor films 16 to 18 are formed on one major surface 15 of the substrate 1. The conductor film 16 is electrically connected with the internal electrode 10 through an internal hole 19 passing through the ceramic layer 2. Further, two through hole connecting portions 20 and 21, for example, pass through the substrate 1, so that the through hole connecting portion 20 electrically connects the conductor film 17 and the internal electrodes 10, 12 and 14 with each other while the other through hole connecting portion 21 electrically connects the conductor film 18 and the internal electrodes 11 and 13 with each other.

When the ceramic multilayer substrate 1 shown in FIG. 11 is obtained by the aforementioned method, however, the following problems are encountered.

A laminate of ceramic green sheets prepared to obtain the laminated structure of the ceramic layers 2 to 9 is pressurized in a stage before firing, as hereinabove described. Extremely high pressure is applied for such pressurization as understood from the aforementioned numerical values, to cause distortion of the green ceramic laminate, including metal paste films for providing the internal electrodes 10 to 14. In general, such distortion is so nonuniform that it is difficult to obtain the green ceramic laminate, including the metal paste films, in designed dimensions. Thus, such a green ceramic laminate frequently deviates from the designed dimensions, causing poor yields. Nonuniform distortion of the green ceramic laminate in the aforementioned pressurizing step causes a significant problem particularly in the ceramic multilayer substrate 1 shown in FIG. 11, for example, which requires high positioned accuracy for the internal electrodes 10 to 14, the internal hole 19 and the like.

Further, dried ceramic green sheets for providing the ceramic layers 2 to 9 are basically different in material composition from dried metal paste films for providing the internal electrodes 10 to 14. Sufficient junction strength cannot be attained by compressing such members of basically different materials under mechanical pressure, and hence the finished product obtained upon firing exhibits a reduced rupture strength and resistance against thermal shock. In extreme cases, delamination may result.

In order to obtain large capacitance in a laminated ceramic capacitor, for example, the ceramic layer located between each pair of internal electrodes is most typically reduced in thickness. Referring to FIG. 12, a ceramic green sheet 22 is so thinned that its physical thickness 23 is substantially equal to physical thickness 25 of a metal paste film 24 upon drying. When such ceramic green sheets 22 are stacked with each other, the thickness 25 of the metal paste film 24 partially formed on one major surface of each ceramic green sheet 22 cannot be neglected such that, as shown in FIG. 13, relatively large stress remains in portions 27 and 28 corresponding to edges of the metal paste films 24 upon pressurization of a laminate 26 of the ceramic green sheets 22. Such stress causes delamination or insufficient resistance against thermal shock after firing.

FIGS. 14 and 15 show the so-called print lamination method, which is adapted to solve the aforementioned problem. This method basically repeats the steps shown in FIGS. 14 and 15. Referring to FIG. 14, for example, a squeegee 31 is driven along the direction of the arrow to act on a metal paste member 30 which is placed on a screen 29, thereby to form a metal paste film 33 for providing an internal electrode. Then, as shown in FIG. 15, another squeegee 36 is driven along the direction of the arrow to act on a ceramic slurry member 35 which is placed on a screen 34, thereby to form a green ceramic layer 37 for covering the metal paste film 33. Respective ones of such ceramic slurry members 35 and metal paste members 30 are repeatedly printed and dried to obtain a desired laminate.

However, the aforementioned print lamination method exhibits the following problems.

First, the green ceramic layer formed by printing exhibits a higher degree of defects than a sheet formed through casting by the doctor blade method or the like. It is necessary to reduce the degree of defects by repeating the printing step a plurality of times particularly for forming a green ceramic layer to be held between internal electrodes. This results in reduced productivity.

Further, the thickness of the ceramic layer located between the internal electrodes must be adjusted by merely controlling printing conditions. Such control is relatively difficult in practice. In addition, the thickness of the ceramic layer cannot be easily managed if printing must be repeated a plurality of times in order to obtain one ceramic layer as hereinabove described. Thus, the capacitance deviates from a designed value and reduces yields.

In order to attain a sufficient degree of mechanical strength (as is required for a laminated ceramic capacitor, for example), upper and lower portions of the laminate must be covered with ceramic outer layers having no internal electrodes. However, the thickness of the ceramic layer which can be formed by screen printing is no more than several to tens of micrometers, if these layers must be hundreds of micrometers thick, the number of printing operations required is extremely high thereby reducing productivity.

In both of the aforementioned method of forming ceramic green sheets through casting by the doctor blade method or the like and the method of forming green ceramic layers by the print lamination method, pores and pinholes may be defined in the ceramic layers upon reduction in thickness. Thus, a capacitor may be reduced in voltage resistance, for example, or, in an extreme case, a short may be created across the internal electrodes.

SUMMARY OF THE INVENTION

Accordingly, an object of the present invention is to provide a method of manufacturing a ceramic laminate, and more specifically, to provide a method of stacking ceramic green sheets, which can advantageously solve the aforementioned problems of the prior art.

The present invention is directed to a method of manufacturing a ceramic laminate, which generally comprises steps of preparing a plurality of ceramic green sheets containing ceramic powder and a first binder, forming a metal paste film containing metal powder and a second binder for providing an internal electrode of a laminated ceramic capacitor, for example, on one major surface of at least one of the plurality of ceramic green sheets and thereafter stacking the plurality of ceramic green sheets with each other.

In order to solve the aforementioned technical problems, the present invention is characterized in that a junction member contains a solvent which can commonly dissolve the first and second binders, to be applied between adjacent pairs of ceramic green sheets which are stacked with each other.

In the present invention, the plurality of ceramic green sheets containing the ceramic powder and the first binder are not necessarily of the same materials with respect to the ceramic powder and the binder, but may be prepared from different materials.

According to the present invention, a plurality of ceramic green sheets are stacked to obtain a laminate through chemical junction by a junction member applied between adjacent pairs of the ceramic green sheets, with application of no high pressure. Thus, the laminate is protected against ununiform distortion, thereby to prevent reduction in yield caused by deviation in capacitance etc.

The junction member contains a solvent which can dissolve both of the first binder contained in the ceramic green sheets and the second binder contained in the metal paste films, thereby to increase junction strength between the ceramic green sheets themselves and between the ceramic green sheets and the metal paste films. Thus, rupture strength after firing is improved, while resistance against thermal shock is enhanced. Further, defectiveness such as delamination is reduced.

The junction member employed in the present invention can contain ceramic slurry, in order to fill up pores and pinholes upon application to the ceramic green sheets. Thus, ceramic layers located between internal electrodes can be reduced in thickness with no reduction in voltage resistance and no short across the internal electrodes, thereby to obtain a small-sized capacitor having large capacitance.

Further, also advantageously solved is the problem that thickness of a ceramic green sheet is reduced to be substantially identical to that of a metal paste film for providing an internal electrode such that the thickness of the metal paste film partially formed on the ceramic green sheet for providing the internal electrode cannot be neglected to result in residual stress, causing delamination and reduction in resistance against thermal shock, around edges of the metal paste film upon pressurization of the laminate. This problem is solved because there is no need to positively pressurize the laminate under high pressure according to the present invention, while the junction member can advantageously absorb difference in thickness between a part of the ceramic green sheet provided with the metal paste film and the remaining part at need.

Although a large amount of binder is generally required in the prior art to adhere metal paste films to ceramic green sheets in a step of pressurizing an unfired laminate, the amount of such a binder can be reduced according to the present invention, thereby to reduce thickness of the metal paste films in response. This feature of the present invention is also effective to solve the aforementioned problem concerning difference in thickness between parts of the ceramic green sheets caused by formation of the metal past films.

Further, although a large amount of plasticizer must be generally contained in ceramic green sheets which are subjected to a pressurizing step as in the prior art, the amount of such a plasticizer can be reduced according to the present invention, whereby the ceramic green sheets can be increased in thickness and reduced in contraction upon drying, to improve the quality of a finished product.

According to the present invention, no pressurizing step is required dissimilarly to the prior art, whereby the cost required for such a pressurizing step can be saved to extremely reduce the manufacturing cost.

These and other objects, features, aspects and advantages of the present invention will become more apparent from the following detailed description of the present invention when taken in conjunction with the accompanying drawings.

DESCRIPTION OF THE PREFERRED EMBODIMENTS

The present invention will now be described in more detail with reference to an embodiment of a method of manufacturing a laminated ceramic capacitor.

Figure 1:
FIGS. 1 to 7 are enlarged sectional views sequentially showing typical steps included in an embodiment of a method of manufacturing a laminated ceramic capacitor according to the present invention.

As shown in FIG. 1, a ceramic slurry is applied to one surface of a carrier film 40 by the doctor blade method or the like to form a ceramic green sheet 41, which is thereafter dried.

Figure 2:
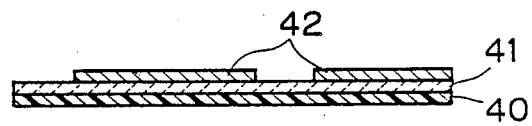

Then, as shown in FIG. 2, metal paste films 42 for providing internal electrodes are formed on one major surface of the ceramic green sheet 41 by screen printing or the like, and thereafter dried. The ceramic green sheet 41 may be separated from the carrier film 40, to carry out this step.

Figure 3:
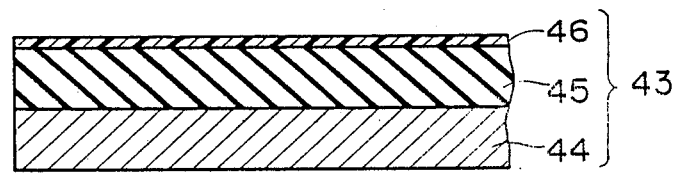

As shown in FIG. 3, a base 43 is prepared to be employed for carrying out a stacking step. The base 43 comprises a rigid plate 44, which is adapted to facilitate location of substances to be stacked in the later stacking step. In order to repeat heating and cooling operations in the stacking step, the rigid plate 44 is preferably formed of a material having a small thermal expansion coefficient, such as super invar of nickel steel, whose thermal expansion coefficient is about 1/100 of that of stainless steel. Alternatively, the rigid plate 44 may be formed of glass, ceramic or the like. The rigid plate 44 is about 0.5 to 5 mm in thickness. An elastic layer 45 of silicone rubber, for example, is formed on the rigid plate 44, in order to absorb irregularities in the rigid plate 44 during the stacking step. The elastic layer 45 has thickness of about 1 to 5 mm, and hardness of about 40 to 80. A resin film 46 of polyethylene telephthalate, for example, is formed on the elastic layer 45.

The stacking step is carried out after the preparation of the base 43. In preferred embodiment now described, the ceramic green sheet 41 contains barium titanate ceramic powder containing about 13 percent by weight of an acrylic binder, and is formed into a sheet by employing a ceramic slurry which is prepared by dissolving such a material in a delay solvent such as BCA (butyl carbitol acetate). It has been confirmed that the following stacking step can be similarly carried out by employing other ceramic materials such as an alumina ceramic material or by employing other binders such as a cellulose or vinyl binder.

Figure 4:
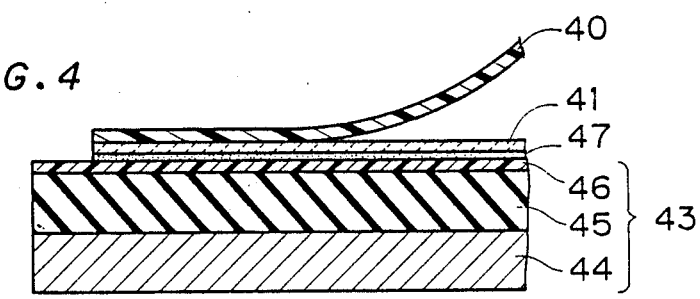

First, a junction member 47 is applied on the base 43 by screen printing, pad printing, the doctor blade method or the like, as shown in FIG. 4. The junction member 47 is prepared from a slurry having the same raw material system (i.e., the same components) and the same binder system as the ceramic green sheet 41. Then, the ceramic green sheet 41 prepared as shown in FIG. 1 is stacked onto the junction member 47, to contain no air. Then the carrier film 40 is separated from the ceramic green sheet 41. The carrier film 40 may be separated before stacking of the ceramic green sheet 41.

Thereafter the junction member 47, the base 43 and the ceramic green sheet 41 are dried at a temperature of 150° C. for about two minutes, for example. The dried substance is then cooled.

The aforementioned step is repeated a desired number of times, to obtain a lower outer layer block 48 (FIG. 5) formed of a plurality of ceramic green sheets 41 which have no metal paste films 42 provided thereon.

Figure 6:
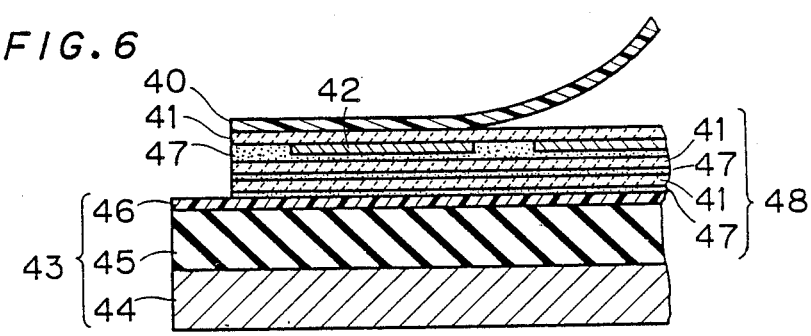

Then, a ceramic green sheet 41, which is provided with the metal paste films 42 as shown in FIG. 2, is stacked on the lower outer layer block 48. As shown in FIG. 6, a junction member 47 is applied over the entire surface of the outer layer block 48. The method used to apply and the composition of the junction member 47 are similar to those in the case of the junction member 47 as hereinabove described with reference to FIG. 4. Then, the ceramic green sheet 41 shown in FIG. 2 is stacked on the junction member 47 while downwardly directing the metal paste films 42, to contain no air. Thereafter the carrier film 40 is separated from the ceramic green sheet 41. The carrier film 40 also may be separated before stacking. Thereafter the junction member 47 is dried, together with the base 43 and so on, at a temperature of 150° C. for about two minutes, for example. The dried substance is then cooled.

Further ceramic green sheets 41 having metal paste films 42 are stacked as shown in FIG. 6 a desired number of times. The metal paste films 42 are aligned along the direction of stacking to provide internal electrodes of a laminated ceramic capacitor, as a matter of course.

Figure 5:
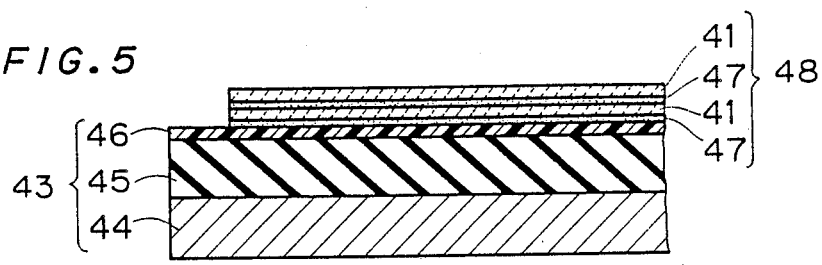
Figure 7:
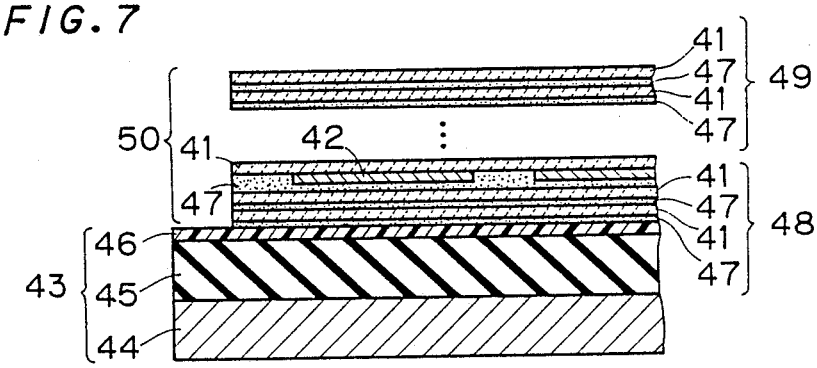

Then, steps similar to those described with reference to FIGS. 4 and 5 are carried out in order to form an upper outer layer block 49 as shown in FIG. 7.

Thus, a green ceramic laminate 50 is obtained, to be subjected to a final drying step at a temperature of 90° to 100° C. for about 24 hours, for example. The final drying step is adapted to dry solvents contained in the green ceramic laminate 50 as completely as possible.

Thereafter the laminate 50 is cut to provide a chip having prescribed dimensions, calcined and subjected to firing and then provided with external electrodes, thereby to provide a desired laminated ceramic capacitor.

The aforementioned final drying step may be carried out at the same time in a calcination condition upon cutting into the chip form.

In the aforementioned embodiment, the thickness of the ceramic green sheet 41 in a green state may be about 5 to 30 μm in practice.

The junction member 47 may be prepared from slurry which is identical in raw material system to the ceramic green sheet 41 but is different in binder system from the same. When an aqueous binder is employed for the ceramic green sheet 41, for example, the junction member 47 may be prepared from slurry containing an organic binder.

In the above manufacturing method for obtaining a laminated ceramic capacitor, the ceramic green sheets 41 contained in the laminate 50 are adapted to provide dielectric members, for example. On the other hand, ceramic green sheets employed for a laminated LC composite component, for example, are not identical in material to each other but are prepared from different materials to provide dielectric sheets and magnetic sheets, respectively. Also in this case, a junction member may be prepared from a material containing a solvent which can commonly dissolve binders contained in the respective ones of such sheets of different materials.

The slurry employed for the junction member is generally formed of ceramic powder, a binder, a plasticizer and a solvent. The solvent must be capable of commonly dissolving the binders contained in the ceramic green sheets and the metal paste films. The materials are preferably in such ratios that the slurry can be thinly applied as uniformly as possible to be easily diffused and evaporated in a drying step to enable the ceramic green sheets to be joined with each other through dissolution of the binders. If such condition is satisfied, the junction member can be prepared from a solvent only.

In the step shown in FIG. 6, the junction member 47 located between the ceramic green sheet 41 provided with the metal paste films 42 and the adjacent green sheet 41 is applied over the entire surface of the adjacent ceramic green sheet 41 to be joined with the same. In some cases, this can cause problems due to the fact that the dried metal paste films 42 are not located across the entire width of the green sheet and the spacing between the upper surface of the lower green sheet 41 and the lower surface of the upper green sheet 41 on the one hand and the lower surface of the metal paste films 42 on the other varies by about 50%. When the ceramic green sheets 41 are reduced in thickness or the number of sheets 41 stacked together is increased, the outer surface of the finished product may be bulged or stress may be caused by contraction in drying, calcining and firing to remain around edges of the metal paste films 42 or the internal electrodes to exert bad influence on the quality of the product. The method shown in FIGS. 8 and 9 is preferably used to avoid this problem.

Figure 8:
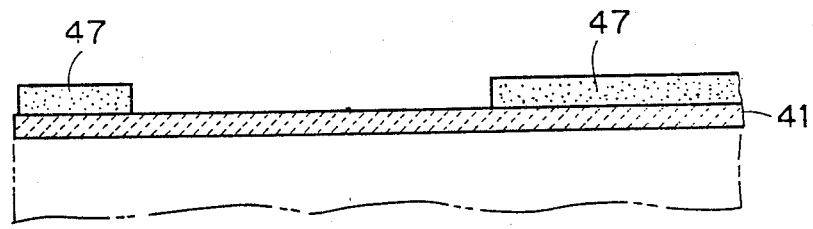
FIGS. 8 and 9 are enlarged sectional views for illustrating another embodiment of the present invention.
Figure 9:
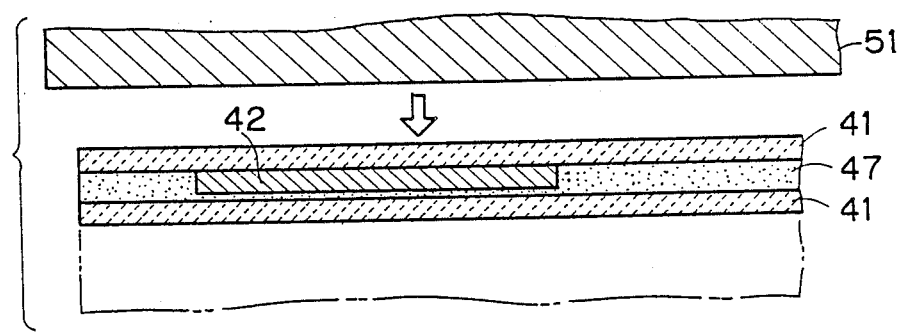

Referring to FIG. 8, a junction member 47 is partially applied on a first ceramic green sheet 41. That is, the junction member 47 is applied on a region removed from the region where the metal paste film 42 formed on a second ceramic green sheet 41 (to be stacked on the first ceramic green sheet 47) is located. Thus, the second ceramic green sheet 41 is so stacked that its associated metal paste film 42 is located in the region provided with no junction member 47. Then, as shown in FIG. 9, a pressurizing member 51 applies pressure on the second ceramic green sheet 41, so that a part of the junction member 47 enters an interface between the metal paste film 42 and the first ceramic green sheet 41. Thus, difference in thickness caused by the metal paste film 42 can be effectively absorbed by the junction member 47.

Figure 10:
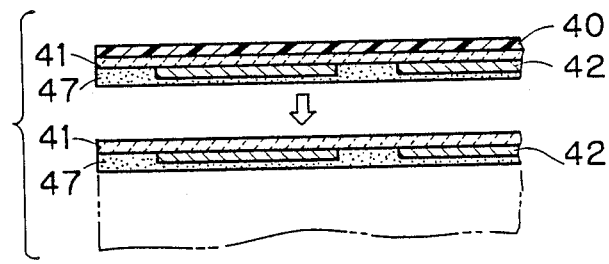
FIG. 10 is an enlarged sectional view for illustrating still another embodiment of the present invention.
Figure 11:
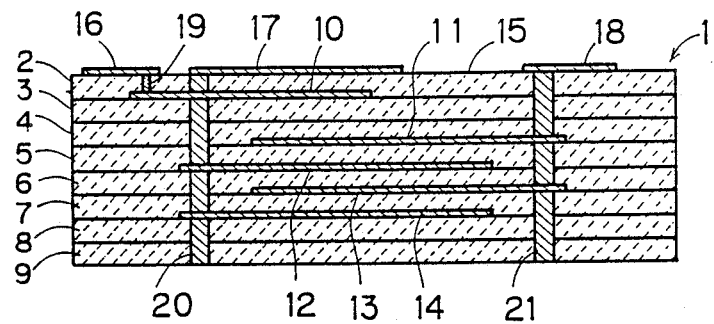
FIG. 11 is a sectional view illustrating a ceramic multilayer substrate 1, which is a component employing a ceramic laminate obtained by the present invention.
Figure 12:
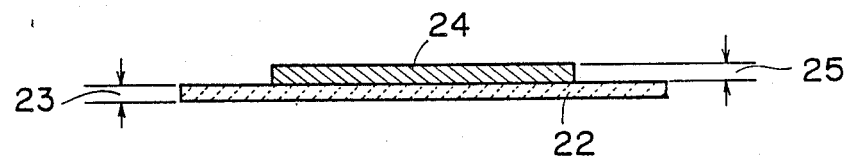
FIGS. 12 and 13 are diagrams for explaining problems of a first prior art example for the present invention.
Figure 13:
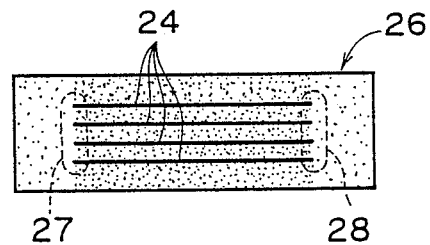
Figure 14:
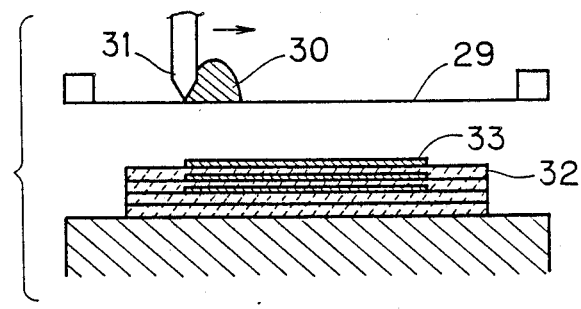
FIGS. 14 and 15 are diagrams for explaining a second prior art example for the present invention.
Figure 15:
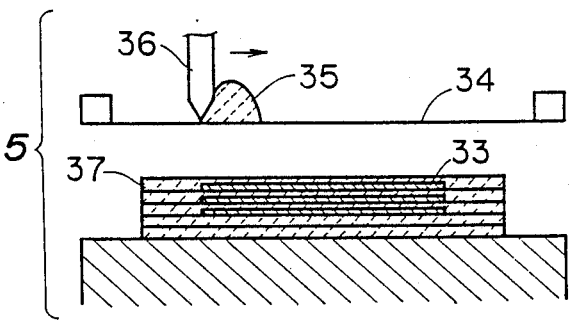

FIG. 10 shows still another embodiment of the present invention, in which a junction member 47 is applied to a second ceramic green sheet 41, which is to be stacked on and jointed to a first ceramic green sheet 41. Junction members may be applied to both of ceramic green sheets to be joined with each other.

While the present invention has been described with reference to the drawings mainly on the case of obtaining a laminated ceramic capacitor, the present invention is widely applicable to various components comprising ceramic laminates, such as a laminated LC composite part, a ceramic multilayer substrate and the like.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of manufacturing a ceramic laminate, said method comprising the steps of:
    preparing first and second ceramic green sheets containing a first ceramic powder and a first binder;
    forming a metal paste film containing a metal powder and a second binder on one major surface of said second ceramic green sheets;
    preparing a junction member containing a solvent capable of dissolving both said first binder and said second binder; and
    stacking said first and second ceramic green sheets and said junction member together in such a manner that said metal paste film and said junction member are located between opposing surfaces of said first and second ceramic green sheets.

2. A method in accordance with claim 1, wherein said stacking step comprises the step of placing said second ceramic green sheet upon said first ceramic green sheet.

3. A method in accordance with claim 2, wherein said junction member is applied on said opposing surface of said first ceramic green sheet prior to said stacking step.

4. A method in accordance with claim 2, wherein said junction member is applied on said opposing surface of said second ceramic green sheet prior to said stacking step.

5. A method in accordance with claim 2, wherein said junction member is a first junction member, said method further includes the step of preparing a second junction member containing said solvent and said first junction member is applied on said opposing surface of said first ceramic green sheet and said second junction member is applied on said opposing surface of said second ceramic green sheet prior to said stacking step.

6. A method in accordance with claim 2, wherein said second ceramic green sheet is held by carrier means and placed on said first ceramic green sheet while being held by said carrier means, and wherein said method further comprising the step of separating said carrier means from said second ceramic green sheet after said second ceramic green sheet is placed upon said first ceramic green sheet.

7. A method in accordance with claim 1, wherein said junction member comprises ceramic slurry containing second ceramic powder and a third binder in addition to said solvent.

8. A method in accordance with claim 7, wherein said first ceramic powder and said second ceramic powder are made up of the same components as each other, and said first binder and said third binder are made up of the same components as each other.

9. A method in accordance with claim 7, wherein said first ceramic powder and said second ceramic powder are made up of the same components as each other, and said first binder and said third binder are made up of different components than each other.

10. A method in accordance with claim 7, wherein said first ceramic powder and said second ceramic powder are made up of different components than each other, and said first binder and said third binder are made up of the same components as each other.

11. A method in accordance with claim 7, wherein said first ceramic powder and said second ceramic powder are made up of different components than each other, and said first binder and said third binder are made up of different components than each other.

12. A method in accordance with claim 1, wherein said opposing surfaces are opposing major surfaces of said first and second ceramic green sheets.

13. A method in accordance with claim 1, wherein said junction member is applied to at least one of said opposing surfaces in an area where said metal paste film is not located.

14. A method of manufacturing a ceramic laminate for a laminated ceramic capacitor, said method comprising the steps of:
    preparing first and second ceramic green sheets containing ceramic powder and a first binder;
    forming a metal paste film containing metal powder and a second binder for providing an internal electrode on one major surface of each said ceramic green sheet;
    preparing a junction member containing a solvent capable of dissolving both said first binder and said second binder; and
    stacking said first and second ceramic green sheets and said junction member with each other in such a manner that said junction member is located between opposed surfaces of said first and second ceramic green sheets and at least one of said metal paste films is located between said opposing surfaces.

15. A method of manufacturing a ceramic laminate, said method comprising the steps of:

preparing a first ceramic green sheet containing first ceramic powder and a first binder;

preparing a second ceramic green sheet containing a second ceramic powder and a second binder;

forming a metal paste film containing metal powder and a third binder on one major surface of at least one of said first and second ceramic green sheets;

preparing a junction member containing a solvent capable of dissolving said first, second and third binders; and stacking said first and second ceramic green sheets and said junction member together in such a manner that said metal paste film and said junction member are located between opposing surfaces of said first and second ceramic green sheets.

16. A method in accordance with claim 15, wherein said metal paste film and said junction member are sandwiched between said opposing major surfaces of said first and second ceramic green sheets.

* * * * *